(12) United States Patent
Ma

(10) Patent No.: US 7,553,202 B2
(45) Date of Patent: Jun. 30, 2009

(54) ELECTRICAL TERMINAL

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/005,329

(22) Filed: Dec. 26, 2007

(65) Prior Publication Data

US 2008/0153363 A1 Jun. 26, 2008

(30) Foreign Application Priority Data

Dec. 26, 2006 (CN) .......................... 2006 1 0161700

(51) Int. Cl.
*H01R 24/00* (2006.01)
(52) U.S. Cl. ....................................... 439/839
(58) Field of Classification Search ................. 439/838, 439/60, 862, 751, 733.1, 660, 630
See application file for complete search history.

(56) References Cited

U.S. PATENT DOCUMENTS

| 5,437,556 A | * | 8/1995 | Bargain et al. ................. 439/66 |
| 5,980,323 A | * | 11/1999 | Bricaud et al. ............. 439/630 |
| 6,039,590 A | * | 3/2000 | Kunishi ...................... 439/247 |
| 6,186,816 B1 | | 2/2001 | Lu et al. |

* cited by examiner

*Primary Examiner*—Jean F Duverne
(74) *Attorney, Agent, or Firm*—Wei Te Chung

(57) ABSTRACT

An electrical terminal (1) includes a resilient arm (10) and a separate solder member (11) contacted with the resilient arm. The resilient arm includes a base portion having a middle portion (101), an inserting portion (103) disposed adjacent to the middle portion, and a curved portion (102) interconnected a lower end of the middle portion and the inserting portion. The resilient arm has a cantilever (104) extending from an upper end of the middle portion, and a contact portion (105) formed on an upper end of the cantilever. The separate solder member has an elastic portion (111) connecting with the base portion, and a solder seat (112) perpendicular to the elastic portion for attaching thereon a solder ball.

10 Claims, 2 Drawing Sheets

ELECTRICAL TERMINAL

BACKGROUND OF THE INVENTION

1. Field of the Invention

The present invention relates to an electrical terminal, and particularly to an electrical terminal used in electrical connectors for electrically connecting an electrical package, such as IC package, with a circuit substrate, such as a printed circuit board (PCB).

2. Description of Prior Arts

An electrical terminal used in an electrical connector for electrically connecting an IC package to a PCB is disclosed in U.S. Pat. No. 6,186,816 issued on Feb. 13, 2001. The electrical connector has a base defining a number of first passageways, and a plurality of electrical terminals. Each electrical terminal includes a retaining portion for engaging with the first passageway, a solder portion extending downwardly from an end of the retaining portion for connecting a solder ball, an elastic portion extending upwardly from an opposite end of the retaining portion, and a contacting portion formed on the elastic portion. The electrical connector further includes an adjusting member having a number of second passageways for insertion of the solder portions. A concave portion is defined on the bottom portion of the adjusting member for fixing the solder ball.

During assembly, the solder portions of the terminals are inserted in the second passageways and into the concave portions of the adjusting member. The solder balls are disposed in the concave portions for connecting with the solder portions, which complicates the assembly of the electrical connector and wastes material.

Hence, it is desirable to provide an improved electrical terminal to overcome the aforementioned disadvantages.

SUMMARY OF THE INVENTION

An object of the present invention is to provide an electrical terminal having a separate solder member to enable the solder ball to be attached to the electrical terminal conveniently.

To achieve the above object, an electrical terminal includes a resilient arm and a separate solder member contacted with the resilient arm. The resilient arm includes a base portion having a middle portion, an inserting portion disposed adjacent to the middle portion, and a curved section interconnected a lower end of the middle portion and the inserting portion. The resilient arm has a cantilever extending from an upper end of the middle portion, and a contact portion formed on an upper end of the cantilever. The separate solder member has an elastic portion for contacting with the base portion, and a solder seat perpendicular to the elastic portion for attaching thereon a solder ball.

Advantages of the present invention are to provide an electrical terminal including a separate solder member having a seated potion, which enables the solder ball to be attached to the electrical terminal conveniently.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
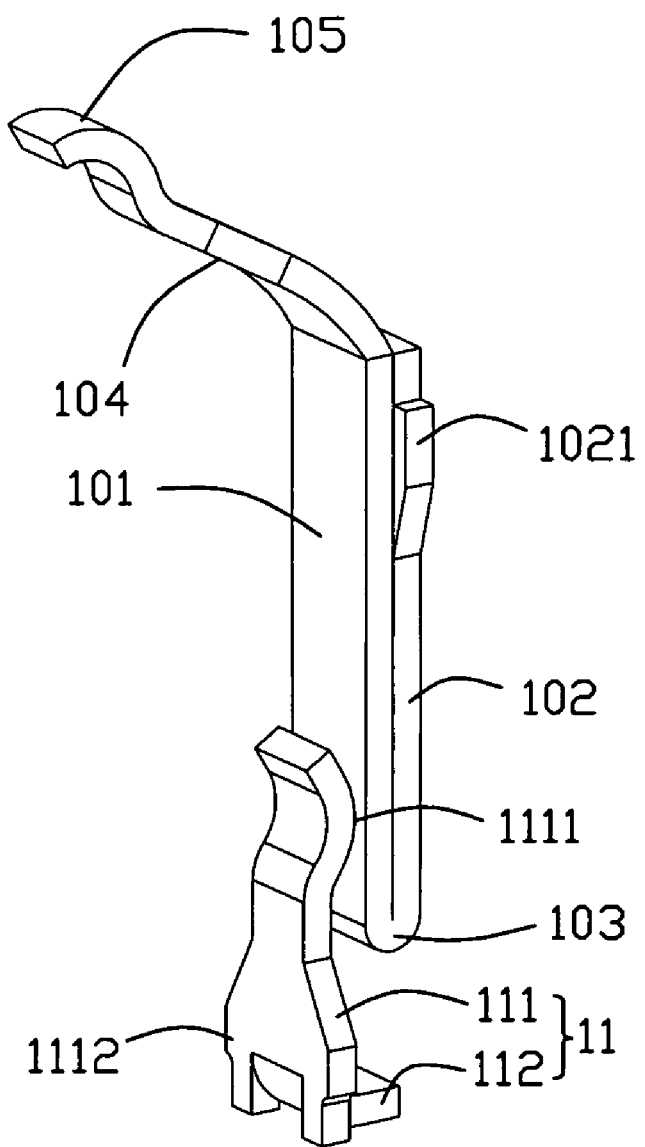
FIG. 1 is a perspective view of an electrical terminal of the present invention.
Figure 2:
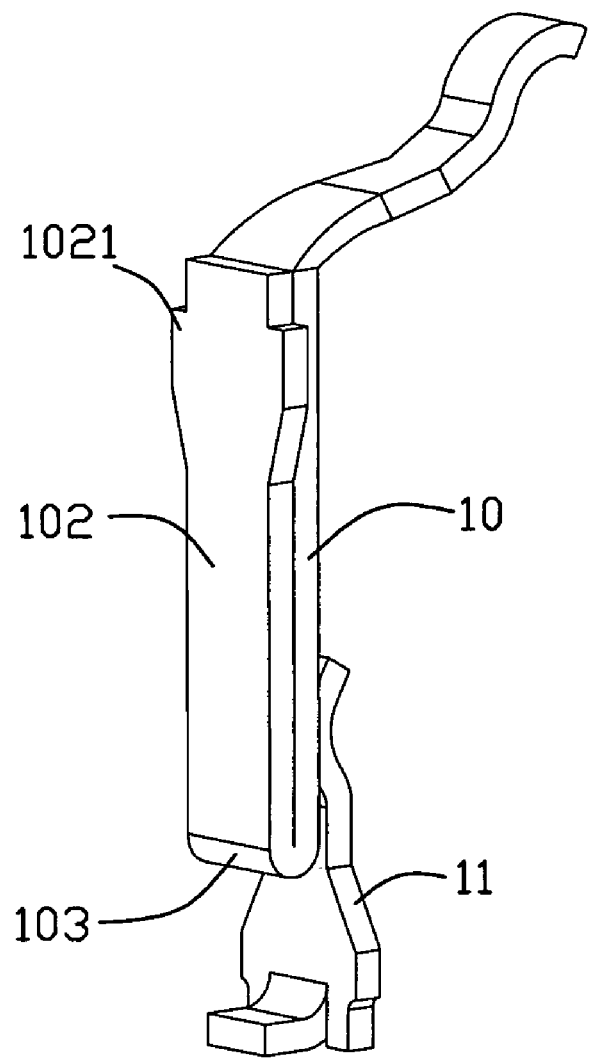
FIG. 2 is a perspective view similar to FIG. 1, taken from another aspect.

Reference will now be made to the drawing figures to describe the present invention in detail. FIGS. 1-2 show an electrical terminal 1 used in an electrical connector (not shown) for electrical connecting an electronic package such as IC package (not shown) with a circuit substrate such as a printed circuit board (not shown). The electrical terminal 1 is formed by stamping and forming a metal plate, and has a resilient arm 10, and a separate solder member 11 resiliently contacting with the resilient arm 10.

The resilient arm 10 has a base portion (not labeled) including a middle portion 101, an inserting portion 102 adjacent to the middle portion 101, and a curved section 103 interconnected a lower end of the middle portion 101 and the inserting portion 102. The middle portion 101 is a substantially rectangular plate extending in a direction perpendicular to the printed circuit board, and has an upper and a lower end (not labeled) formed thereon. The inserting portion 102 has a size same to that of the middle portion 101. The inserting portion 102 has a pair of retaining portions 1021 formed on side edges thereof for retaining the resilient arm 10 in a passageway (not shown) defined in a housing (not shown) used in the electrical connector. The inserting portion 102 is connected to a material belt (not shown) before the electrical terminal 1 is assembled in the housing of the electrical connector.

The resilient arm 10 further has a cantilever 104 extending obliquely from the upper end of the middle portion 101, and a contact portion 105 formed on a free end of the cantilever 104 for contacting with a contact pad (not shown) formed on the IC package. The contact portion 105 has a curved surface (not labeled) for ensuring the engagement between the contact portion 105 and the contact pad.

The separate solder member 11 has an elastic portion 111, a camber portion 1111 formed on upper portion of the elastic portion 111 for contacting with the middle portion 101. The elastic portion 111 has a pair of retaining portions 1112 formed on side edges thereof for retaining the solder member 11 in the passageway of the housing. The separate solder member 11 has a solder seat 112 formed on a lower edge of the elastic portion 111, and extending in a direction perpendicular to the elastic portion 111 and parallel to the printed circuit board. The solder seat 112 has a bottom surface (not labeled), and a recess (not shown) defined on the bottom surface for receiving a solder ball (not shown). The separate solder member 11 connects to the printed circuit board by the solder seat 112 attaching the solder ball. The elastic portion 111 of the separate solder member 11 elastically contacts with the middle portion 101 of the resilient arm 10. Therefore, the electrical terminal 1 used in the electrical connector electrically connects the IC package with the printed circuit board.

Other objects, advantages and novel features of the invention will become more apparent from the following detailed description of a preferred embodiment when taken in conjunction with the accompanying drawings.

What is claimed is:

1. An electrical terminal for connecting to a printed circuit board via a solder ball comprising:
   a resilient arm comprising:
      a base portion having a middle portion, an inserting portion disposed adjacent to the middle portion, and a curved section interconnected with a respective lower end of the middle portion and the inserting portion;

a cantilever extending from an upper end of the middle portion; and a contact portion formed on an upper end of the cantilever; and a separate solder member having an elastic portion contacting with the base portion, and a solder seat perpendicular to the elastic portion for attaching thereon the solder ball wherein said inserting portion has pair retaining portions formed on side edges thereof to retain the resilient arm in a passageway.

2. The electrical terminal as claimed in claim 1, wherein said elastic portion has a camber portion resiliently contacting with the middle portion.

3. The electrical terminal as claimed in claim 1, wherein said inserting portion has as least one retaining portion formed thereon.

4. The electrical terminal as claimed in claim 1, wherein said elastic portion has at least one retaining portion formed thereon.

5. The electrical terminal as claimed in claim 1, wherein said solder seat has a recess defined on a bottom surface thereof for receiving the solder ball.

6. An electrical contact member for use within a passageway of an insulative housing of an electrical connector, including:

at least one first conductor made of a one piece sheet metal, said conductor including a U-shaped base defining juxtaposed first and second plate intimately laterally engaged with each other and linked to each other via a bight section on a bottom portion of the base so as to have said base essentially be in a double-thickness manner with regard to other portions of the contact;

at least one of said first plate and said second plate including a retention structure thereon for holding the contact in said passageway;

at least one contacting beam obliquely and upwardly extending from a tip of one of said first plate and said second plate;

further includes a second conductor discrete from the first conductor, wherein said second conductor includes a retention section to fasten in the passageway, a spring arm engages with one of said first plate and said second plate, and a solder pad for mounting a solder ball thereon; wherein the one of said first plate and said second plate having the retention structure thereon, is not the one of the first plate and the second plate which the spring arm engages.

7. The contact as claimed in claim 6, wherein solder pad is located under a bight section.

8. The contact as claimed in claim 7, wherein the one of said first plate and said second plate from the tip of which the contacting beam extends, is the same one said spring arm engages.

9. The contact as claimed in claim 6, wherein the one of the first plate and the second plate from the tip of which the contacting beam extends, is not the one of the first plate and the second plate having the retention structure thereon.

10. The contact as claimed in claim 6, wherein the spring arm and the solder pad extend toward a same direction with regard to the retention section.

\* \* \* \* \*